United States Patent [19]

Gerber

[11] Patent Number: 4,675,702
[45] Date of Patent: Jun. 23, 1987

[54] PHOTOPLOTTER USING A LIGHT VALVE DEVICE AND PROCESS FOR EXPOSING GRAPHICS

[75] Inventor: Heinz J. Gerber, West Hartford, Conn.

[73] Assignee: Gerber Scientific Inc., South Windsor, Conn.

[21] Appl. No.: 840,416

[22] Filed: Mar. 14, 1986

[51] Int. Cl.⁴ .................. G01D 9/42; G03B 27/32
[52] U.S. Cl. .................. 346/107 R; 350/356; 354/4; 355/53
[58] Field of Search .......... 346/108, 107 R, 1.1; 354/4, 5; 358/298, 302, 75; 350/356; 355/53

[56] References Cited

U.S. PATENT DOCUMENTS

| | | | |
|---|---|---|---|
| 3,689,932 | 9/1972 | Gerber | 346/29 |
| 3,930,119 | 12/1975 | Schmidt | 350/356 X |
| 4,110,762 | 8/1978 | Tigreat | 354/4 |
| 4,225,224 | 9/1980 | Balasubramanian | 346/108 X |
| 4,278,981 | 7/1981 | Hill | 346/108 |
| 4,312,004 | 1/1982 | Samek | 346/1.1 |
| 4,378,568 | 3/1983 | Mir | 358/75 |

Primary Examiner—Joseph W. Hartary
Attorney, Agent, or Firm—McCormick, Paulding & Huber

[57] ABSTRACT

A photoplotter supports a sheet of photosensitive material for exposure by an associated light source. A light valve device interposed between the light source and the sheet has a main face parallel to the sheet divided into a plurality of subareas or pixels the light transmissivities of which are individually controlled through an associated computer to cause the exposure to be that of a desired graphic or artwork.

4 Claims, 10 Drawing Figures

PHOTOPLOTTER USING A LIGHT VALVE DEVICE AND PROCESS FOR EXPOSING GRAPHICS

BACKGROUND OF THE INVENTION

This invention relates to a photoplotter and a related process for exposing graphics on a sheet of photosensitive material, such as a sheet of photographic film, a mat or plate used in photolithographic printing, a photosensitive-resist covered plate for use in making printed circuitboards, or the like, and deals more particularly with such a photoplotter and process wherein the details of the exposed graphic are defined by a light valve device interposed between the photosensitive surface and a source of light and having a large number of subareas or pixels individually controllable as to their light transmissivity.

As used herein, the term "photoplotter" refers to a device which functions to create, compose and/or plot a graphic during the exposure process from digital information or similar signals supplied by an associated control device such as a computer or numerical controller.

Photoplotters of various different kinds are well known and widely used for exposing graphics on different photosensitive materials. For example, they are commonly used for exposing drawings and/or text on a sheet of photographic film. After development of the film it may become a photographic positive for direct use or it may it become a photographic negative or transparency usable as a mask in a subsequent photoexposure step, such as a mask for making a printed circuitboard or an integrated circuit chip. Known photoplotters are also often used in photolithographic printing processes for exposing photosensitive printing mats or plates and in circuitboard manufacturing processes for directly exposing a layer of photo-resist on a circuitboard blank.

In an early form of photoplotter, such as shown by U.S. Pat. No. 3,330,182, a spot of light is projected onto the photosensitive surface and is moved in X- and Y-coordinate directions relative to the surface to generate a graphic or artwork on the photosensitive sheet, the process involved being analogous to that of writing on a sheet of paper with a pencil or pen except for the pencil or pen being replaced by the light spot.

In another common form of photoplotter, such as shown in U.S. Pat. No. 4,354,196, a light beam, usually a laser beam, is swept across the surface of a photosensitive material in raster fashion and selectively turned on or off for each increment of displacement, or pixel, along the length of each scan line, the resulting graphic being therefore exposed pixelwise generally similar to the way a picture is created on a television screen.

U.S. Pat. Nos. 3,689,932 and 3,724,347 show photoplotters wherein spots or figures created on the screen of a cathode ray tube are used in exposing graphics on a photosensitive material. U.S. Pat. No. 3,695,154 shows a photoplotter which "writes" on a sheet of photosensitive material with a projected light spot, the light spot being additionally variable in size and shape during the writing process to achieve various benefits.

All of the above-mentioned prior art photoplotters have characteristics which individually suit them well for various specific applications, but as a general rule they all tend to require considerable time for the exposure of a reasonably complicated graphic and have other characteristics making them difficult to use or unsatisfactory in certain instances.

The general object of this invention is therefore to provide a new type of photoplotter generally capable of exposing graphics at greater speed than known photoplotters and having characteristics making it more desirable than presently known photoplotters in many applications.

Other advantages and objects of the invention will be apparent from the following description of the preferred embodiments of the invention.

SUMMARY OF THE INVENTION

The invention resides in a photoplotter having a means for supporting a sheet of photosensitive material at an exposure station, a light source directed toward the exposure station and a light valve device located between the exposure station and the light source and having a plurality of subareas or pixels individually controllable to vary the light transmissivity of each subarea. A computer or other control component associated with the light valve device controls or dictates the transmissivity of each subarea so that the light passing through the device exposes a desired graphic on the sheet of photosensitive material supported on the support surface.

The invention further resides in the light from the light source being collimated, in the light valve device being one using liquid crystal material, in the subareas or pixels of the device being arranged in a single row or in a series of rows and columns, and in the light source being one emitting ultraviolet light or light of a number of different colors.

The invention further resides in the light valve device being movable small pixel-sized amounts, or less, relative to the exposure station to allow the generation of certain desirable effects, such as multi-color exposure, half-tone exposure and the filling in of the spaces which may occur between adjacent subareas of the light valve device, by a combination of multiple exposures and shifting of the light valve device between exposures.

The invention also resides in the light source and the light valve device being combined into a single photohead unit with the unit being movable relative to the photosensitive surface being exposed to permit the graphic to be incrementally exposed on the photosensitive surface.

The invention still further resides in a process for exposing a graphic on a sheet of light sensitive material wherein a light valve device is interposed between a light source and the light sensitive surface and has its transmissivity controlled subarea-by-subarea or pixel-by-pixel to cause the light passing through it to expose a desired graphic on the photosensitive material.

DESCRIPTION OF THE PREFERRED EMBODIMENTS

Figure 1:
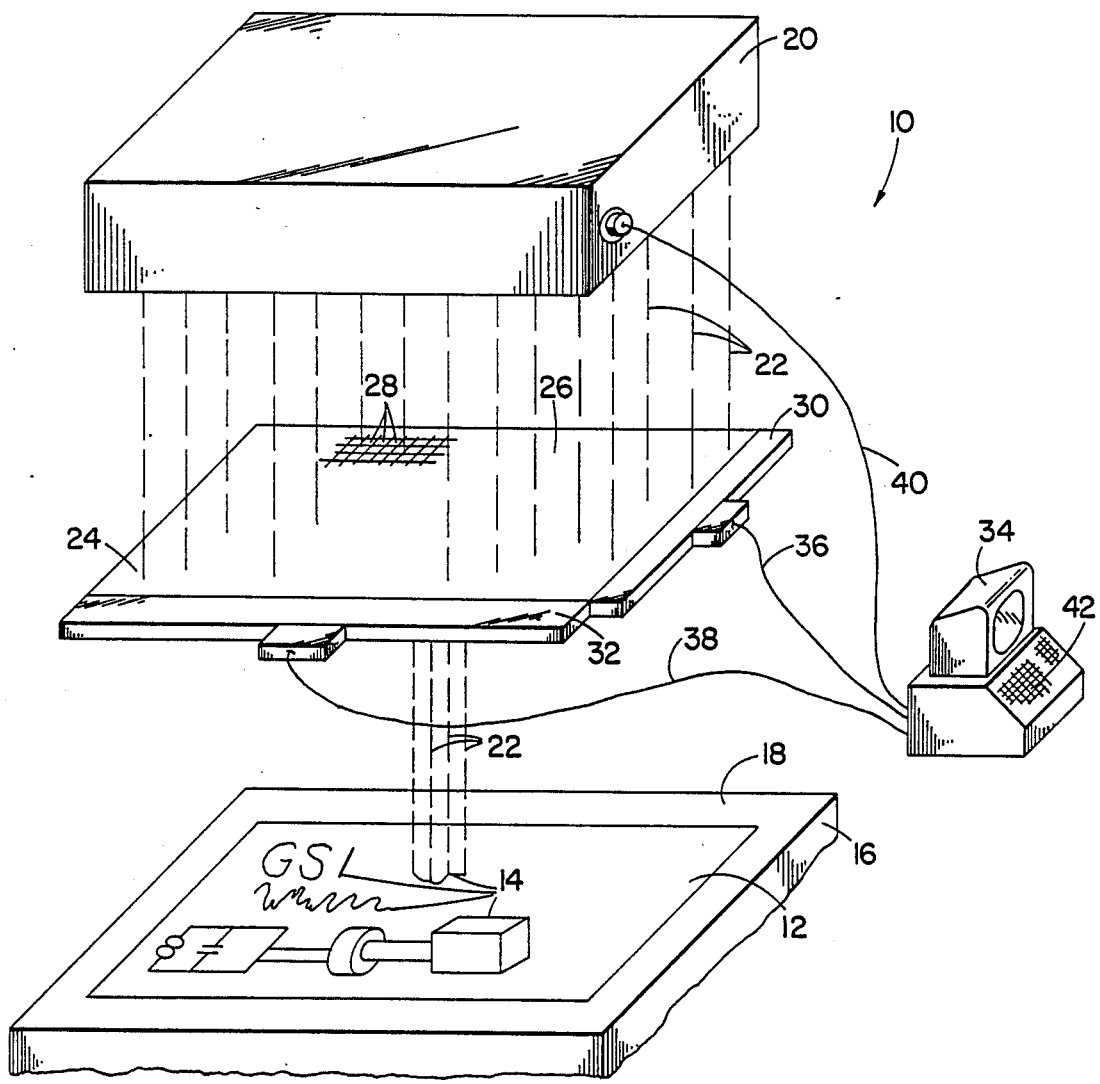
FIG. 1 is a schematic perspective view showing in partly exploded relationship, the components comprising a photoplotter embodying the invention.

Referring to FIG 1, a photoplotter embodying the invention is shown generally at 10 and is used for exposing a graphic on a sheet 12 of photosensitive material. The nature of the sheet 12 may vary, but for purposes of illustration it is taken to be a sheet of photographic film which when developed after exposure becomes a photographic negative used for making subsequent positive copies or which becomes directly a photographic positive. A graphic exposed on the sheet 12 is indicated by way of example at 14 but it will be understood that as a rule such graphic does not become visible until development of the sheet following the exposure.

The photoplotter 10 of FIG. 1 includes a means for supporting the sheet 12 at an exposure station so as to reveal and present its photosensitive surface for exposure. This means is shown to be a table 16 having an upper flat support surface 18 which serves as the exposure station and supports the sheet 12 in flat condition. Any suitable means, not shown, such as a vacuum holddown, may be used to hold the sheet 12 to the support surface 18 during the exposure process.

Above the support surface 18 is a light source 20 which preferably is one operable to emit collimated light, represented by the rays 22, 22, toward the support surface 18. The collimated rays 22, 22 extend generally perpendicular to the support surface 18 and the total beam issuing from the light source 20 and comprised of the rays 22, 22 has a cross-sectional shape and size at least as large as that of the sheet 12 so that the entire sheet 12 may be exposed by the beam without having to move the light source or any other parts relative to the support surface 18. The intensity of the light beam is also preferably uniform over its cross section so that any plane surface inserted into it is uniformly illuminated.

For the purpose of defining the graphics to be exposed on the sheet 12 the photoplotter 10 includes a light valve device 24 interposed between the support surface 18 and the light source 20. This device 24 has a main face or area 26 arranged parallel to the surface, at least as large as the sheet 12 and divided into or containing a large number of subareas, the light transmissivities of which may be individually varied to control the passage of light therethrough from the light source 20 to the sheet 12. The shape, size and arrangement of these subareas 28 may vary from one device 24 to another depending on the type of graphic to be exposed by the photoplotter. For example, when a graphic to be exposed will always either have or not have a given figure or shape at a given location the device 24 may have a corresponding subarea of the same figure or shape to control the exposure or nonexposure of that figure or shape on the sheet 12. For greatest versatility, however, and as shown, the device 24 preferably has its main area 26 divided into subareas 28 arranged in a matrix of rows and columns so as to become or represent pixels from which a graphic of any shape may be exposed on the sheet 12 by individually controlling the transmissivity of each subarea.

The use of a light source emitting collimated light onto the light valve device 24 has the advantage of achieving high resolution—that is, of having the images of the pixels defined by the light valve device sharply transferred to the photosensitive sheet 12 despite some spacing between the horizontal object plane of the device 24, in which the subareas or pixels may be taken to be optically located, and the horizontal plane of the sheet 12, such spacing being due perhaps to the thickness of plates or other layers making up part of the device 24 and/or to an actual spacing between the bottom surface of the device 24 and the sheet 12. In its broader aspects, however, the invention is not limited to the use of collimated light and various other types of light sources may be used in different circumstances. For example, if the bottom of the device 24 is maintained fairly close to the sheet 12 a point source of light, such as a filament or arc bulb, may be used with satisfactory results in many cases, especially if the point source is spaced from the device 24 by a long ray path so that the rays illuminating the device are only slightly diverging.

The light valve device 24 serves substantially the same function as that of a photographic negative, transparency, or mask, as used in many conventional photoreproduction processes, the difference being that the "image" produced by the device 24 is digitally defined, instantaneously variable and controllable at the time of exposure by an associated computer or the like; whereas the conventional negative has a fixed image prepared in advance of the exposure. Therefore, some of the same equipment and techniques as used in the past for illuminating negatives in a photo-reproduction process may be used with the light valve device 24. For example, as explained hereinafter in more detail, the device 24 may be illuminated progressively as by using a laser beam scanner over the upper surface of the device, or the image produced by the device 24 may be projected (rather than contact printed) onto the sheet 12 by using a suitable lens or lens system between the device 24 and the sheet 12 in which case the illumination of the device 24 is preferably such as to have the object plane of the device 24 located in a zone of relatively "confused" light—that is, light comprised of rays of random direction.

The actual construction of the light valve device 24 may vary, but to obtain good resolution and detail in the exposed graphic it is preferred that the subareas 24 be of quite small size, such as squares with sides of a few mils length or circles with diameters of a few mils length. Further, in the illustrated device 24 along one edge portion 30 there is one terminal, not illustrated, for each row of subareas or pixels and along another edge portion 32 is one terminal, not shown, for each column of subareas or pixels. Therefore, each individual subarea 28 is associated with one row terminal and one column terminal and its transmissivity is controlled by electrical signals applied to those terminals. This control of the transmissivity of the individual subareas is effected by an associated controller such as the illustrated computer 34 connected to the edge portions 30 and 32 of the device 24 by cables 36 and 38. This computer 34 also is connected to the light source 20 through a cable 40 and controls the turning on and off of the light source 20. It will, of course, be understood that data defining the graphic to be exposed on the sheet 12 is input into the computer 34, as for example through a keyboard 42 or other interactive device or by means of a record such as a magnetic tape or disc, and that the computer 34 processes such data to produce the signals on the cables 36, 38 and 40 necessary to cause the photoplotter to expose the desired graphic on the sheet 12.

The collimated light emitted by the light source 20 is chosen to match the sensitivity of the sheet 12 to be exposed and generally is light within the visible spectrum. This, however, need not always be the case and, for example where the sheet 12 to be exposed is one sensitive to ultraviolet light, as with some printing mats or plates, the light source 20 is one emitting ultraviolet light. Further, if the sheet 12 is one, such as a Kodacolor or Kodachrome film, sensitive to the color of the exposing light and capable of producing a multi-colored graphic, the light source 20 may be one capable of emitting successively, at different times, light of a number of different colors, such as red, blue and green, as required by the particular material used for the sheet 12. In this case, the computer 34 will operate to energize the light valve device 24 during the time it is used with each color of light so that the light of one color reaching the sheet 12 is controlled separately from the light of another color reaching the sheet 12 as is usually necessary to produce the desired multi-colored graphic. Thus, in one exposure step the device can function as a first color separation mask to expose a first primary color image on the sheet 12, and in subsequent exposure steps it can function as second and third separation masks to expose a second primary color image and then a third primary color image on the sheet 12.

The above-mentioned light source capable of emitting light of a number of different colors may be implemented by a number of individual monochromatic light sources each producing light of a different color or by a single white light source in combination with a number of filters of different color selectively insertable between the source and the device 24. As an alternative to this, however, in the production of a multi-color graphic the light source may be a source of white light and the device 24 constructed to serve also as a light filter so that each subarea or pixel is not only switchable between a non-light transmitting state and a light-transmitting state, but when set to the light transmitting state is further selectively conditionable so as to transmit, for example, either red, blue or green light or light of other primary colors. Such subareas allowing control of the transmitted light color may be implemented by having each subarea be a coarse subarea comprised of three smaller subareas arranged close to one another within the bounds of the coarse subarea with each smaller subarea having a filter element associated with it permitting the transmission of light of only one of the three primary colors and with each of the filter elements of the three smaller subareas of each coarse subarea transmitting a different one of the three primary colors. As a further refinement, in the latter case the device 24 may be made to be movable slightly in and relative to a fixed horizontal reference plane, and have associated with it appropriate driving means (as described hereinafter in connection with FIG. 2), so that when each smaller subarea is brought into play it will occupy a given fixed position in said reference plane so that the exposures made by the three smaller subareas will overlap one another on the sheet 12. In some cases, however, it may be desired or sufficient for each coarse subarea to expose with different colors three small closely adjacent but non-overlapping areas of the sheet 12 in which case shifting of the device 24 between exposures of different colors is not required.

The light valve device 24 may be an active matrix one in which all of the subareas 28 are simultaneously energizable to control their transmissivities. Such active matrix devices are at present of complicated and expensive construction, and a feature of the present invention is that the light valve device 24 may be one of simplier construction wherein the subareas or pixels are energized only one-by-one or row-by-row or column-by-column. That is, unlike visual displays such as used for computer screens, it is not necessary in the photoplotter 10 that a whole graphic be exposed on the sheet 12 at a given instant, but instead it is sufficient if the exposure be made gradually in a type of scanning fashion.

Another feature of the invention is that the photoplotter 10 may be used either to produce two-toned graphics or graphics with half-tones or varying grey scale. For a two-toned graphic, the light valve device 24 may be operated so that each subarea 28 is switchable between two levels of transmissivity, one being a level of substantially zero transmissivity and the other being a substantially fixed level of transmissivity. For halftone graphics, the device 24 may be operated so that each subarea 28 is switchable between a number of different levels of transmissivity one of which is a level of susbtantially zero transmissivity. Where the device 24 is a liquid crystal device, as described below and shown in FIG. 4, this may be done by varying the voltage drop or electric field, which is applied across the liquid crystal layer of each pixel to turn it to a light transmitting state, the transmissivity being directly dependent on the electric field strength in going from a state of zero to a state of maximum transmissivity. The latter type of operation assumes that each time a subarea is energized it is energized for a fixed period of time so that the exposure of the associated subarea of the sheet 12 is controlled solely by variation of the transmissivity of the subarea 28. However, if desired, the exposure of a subarea of the sheet 12 may further be controlled by varying the amount of time each subarea 28 of the device 24 is energized. In this way half-tone values may also be produced when switching the subareas 28 between only two levels of transmissivity, one being a level of substantially zero transmissivity and the other being a substantially fixed level of transmissivity.

Figure 2:
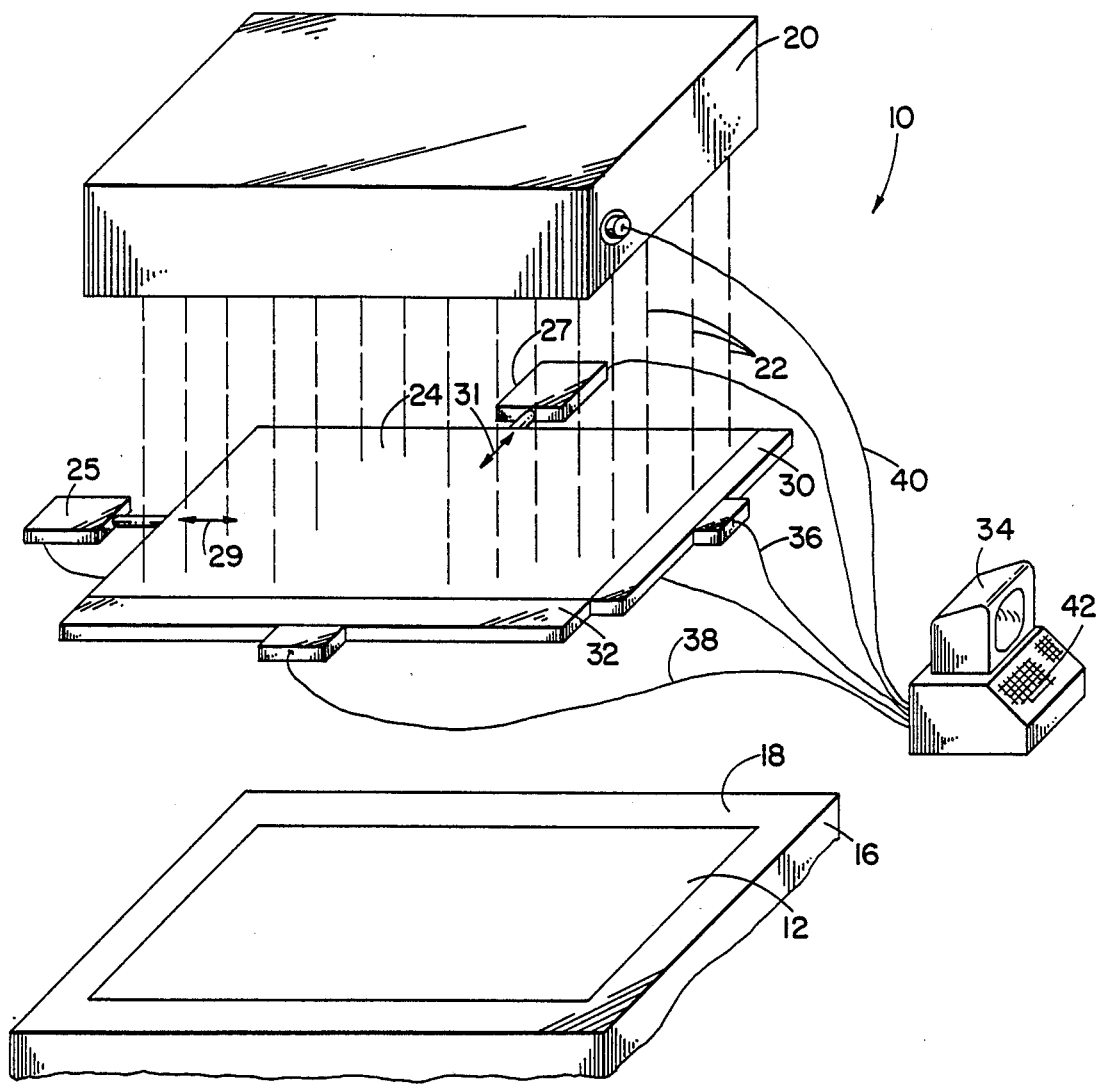
FIG. 2 is a view showing an embodiment of the invention similar to that of FIG. 1 but wherein the light valve device is shiftable relative to the photosensitive sheet being exposed.
Figure 3:
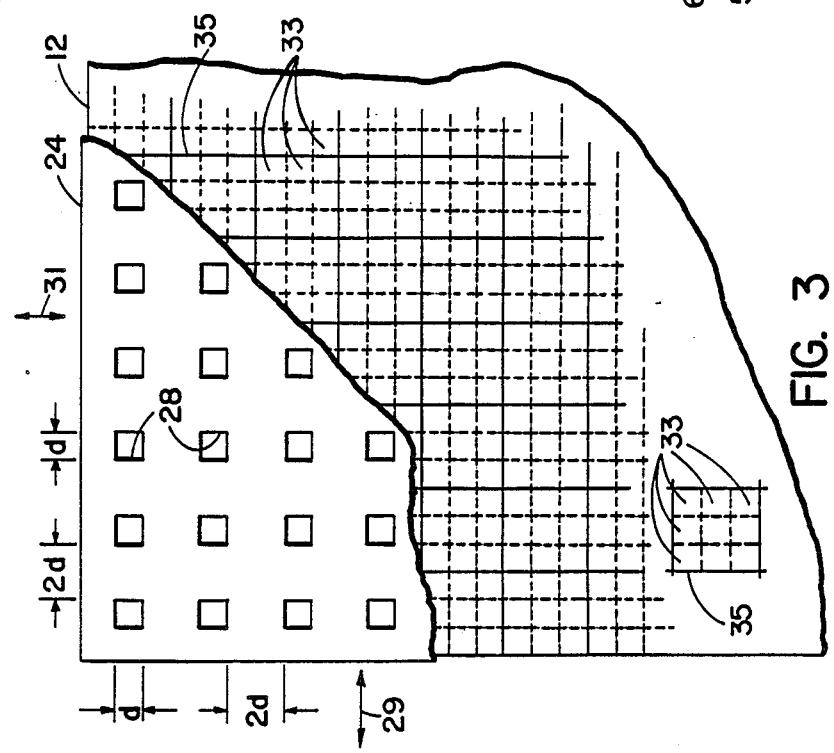
FIG. 3 is a fragmentary plan view showing a portion of the light valve device of FIG. 2 and of the photosensitive sheet being exposed, the pixels of the photosensitive sheet and their division into "dots" being shown by solid and broken lines which are imaginary not appear on the actual sheet.

Still another way of producing half-tone images is shown in FIGS. 2 and 3. In FIG. 2 the light valve device 24 is the same as that of FIG. 1 except for having associated with it two mechanical driving means 25 and 27, such as piezoelectric devices, for respectively shifting the light valve device 24 small amounts in two coordinate directions, indicated by the arrows 29 and 31, in the horizontal plane of the device 24 and relative to the support surface 18 and the sheet 12 of photosensitive material al received thereon. As shown in FIG. 3 the light transmitting subareas 28, 28 of the device 24, as used in FIG. 2, are arranged in rows and columns spaced from one another. Therefore, when the light valve device 24 is in any given fixed position relative to the photosensitive sheet 12 being exposed each subarea 28 will expose only an equivalent small area or "dot" on the sheet 12. However, by shifting the light valve device 24 in its horizontal plane relative to the sheet 12 by small amounts, through the use of the drivers 25 and 27, each subarea 28 may be made, through successive exposures and by shifting between exposures, to expose (or not expose) a number of small areas or "dots" on the photosensitive surface 12 clustered within a small area or pixel of that surface. Different half-tone values may therefore be obtained by controlling the number of small areas or "dots" exposed within each pixel of the photosensitive sheet 12.

By way of a more detailed exemplary illustration, in FIG. 3 the light transmissible subareas 28, 28 are shown to be of square shape, with a length d on each side, and located in rows and columns spaced by the dimension 2d from each other. In FIG. 3 the light valve device 24 is shown in a neutral position relative to the photosensitive sheet 12 in which position each light transmissible subarea 24 is located over the center one of nine "dots" 33 located within a nine dot pixel 35. The driver 25 is effective to shift the device 24 the distance d in either direction along the coordinate axis represented by the arrow 29 from the illustrated neutral position of FIG. 3; and likewise the driver 27 is effective to shift it a distance d in either direction along the coordinate axis represented by the arrow 31. Thus each subarea 28 is movable in succession into alignment with each of the nine dots 33 of its associated pixel 35 on the sheet 12. In the exposure process the device 24 is stepped through a series of nine different positions relative to the sheet 12, causing each subarea 28 to successively register with each of the nine dots 33 of its pixel 35 on the sheet 12, and at the end of each step a new exposure is made with the transmissibilities of the subareas 28 being differently controlled during each of the nine separate exposures required for each complete exposure. Thus, in the finished exposure each pixel 35 of the sheet 12 may have any number of its nine dots exposed to produce the desired half-tone value wanted for that pixel.

In addition to the apparatus of FIGS. 2 and 3 being used to generate half-tone graphics it may also be used to generate two-tone graphics wherein because of constructional considerations it is difficult to provide a light valve device with light transmitting subareas 28 located side-by-side or very close to one another, the shifting of the device 24 and the use of multiple exposures therefore being used to fill in the spaces which would otherwise occur on the exposed sheet 12 if the light valve device 24 were not moved relative to the sheet 12.

Figure 4:
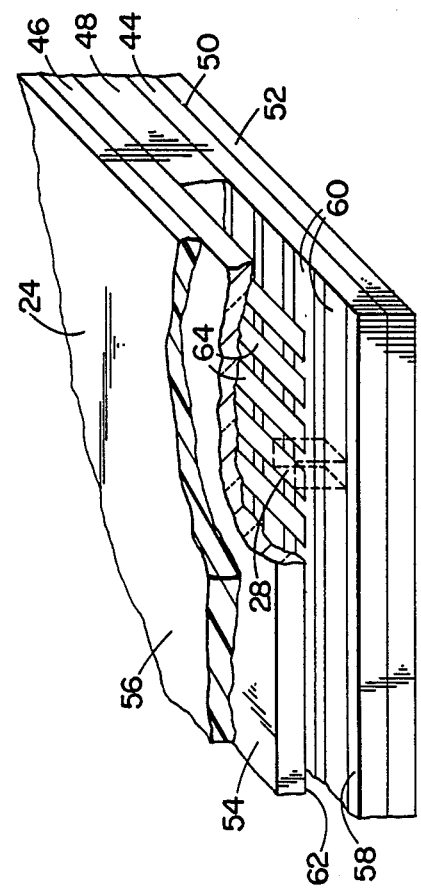
FIG. 4 is an enlarged fragmentary view of a portion of the light valve device of FIG. 1 with certain parts being broken away to better reveal the structure of other parts.

As mentioned, the light valve device 24 of FIG. 1 may be of any suitable construction which provides a large number of subareas 28 whose transmissivities may be individually controlled. Preferably, however, the device 24 is a liquid crystal one, and by way of example may be one such as shown in FIG. 4. This figure shows a small portion of the device 24 in which the thicknesses of its various layers have been exaggerated for purposes of discussion. The illustrated device 24 is made up of a front transparent plate 44 and a rear transparent plate 46 having between them a layer 48 of liquid crystal material. Adjacent the front face 50 of the front plate 44 is a front polarizing layer 52, and adjacent the rear face 54 of the rear plate 46 is a rear polarizing layer 56. On the rear face 58 of the front plate 44 are a plurality of ultra-thin, transparent, metallic conductive strips 60 extending in one direction across the device 24 and spaced uniformly from one another in the other direction. On the front face 62 of the rear plate 46 are a plurality of similar ultra-thin, transparent, metallic conductive strips 64 extending across the device 24 in the direction orthogonal to that of the strips 60. The area over which each strip 60 overlaps one of the strips 64 defines a subarea 28, one of which is shown in FIG. 4 by the broken lines. Thus, by applying proper voltage signals to the strips 60 and 64 the electric field appearing across the liquid crystal layer 48 may be varied at each subarea with such variation of the electric field controlling the polarization of light passing through the liquid crystal layer 48 at that subarea and in turn, in conjunction with the rear polarizing layer 56 and the front polarizing layer 54, controlling the transmissivity of light through that subarea. It will of course be understood that the conductive metallic strips 60 are connected with terminals in the edge portion 30 of the device 24 and the conductive strips 64 are connected with other terminals in the edge portion 32 of the device, as shown in FIG. 1, so that voltage signals may be applied to the strips 60 and 64 under the control of the computer 34. The strips 60 define rows into which the subareas 28 are arranged and the strips 64 define columns. In a typical mode of operation the strips 60 are energized one at a time in sequence and as each strip 60 is energized the strips 64 are energized either in parallel (simultaneously) or serially (in sequence).

Figure 5:
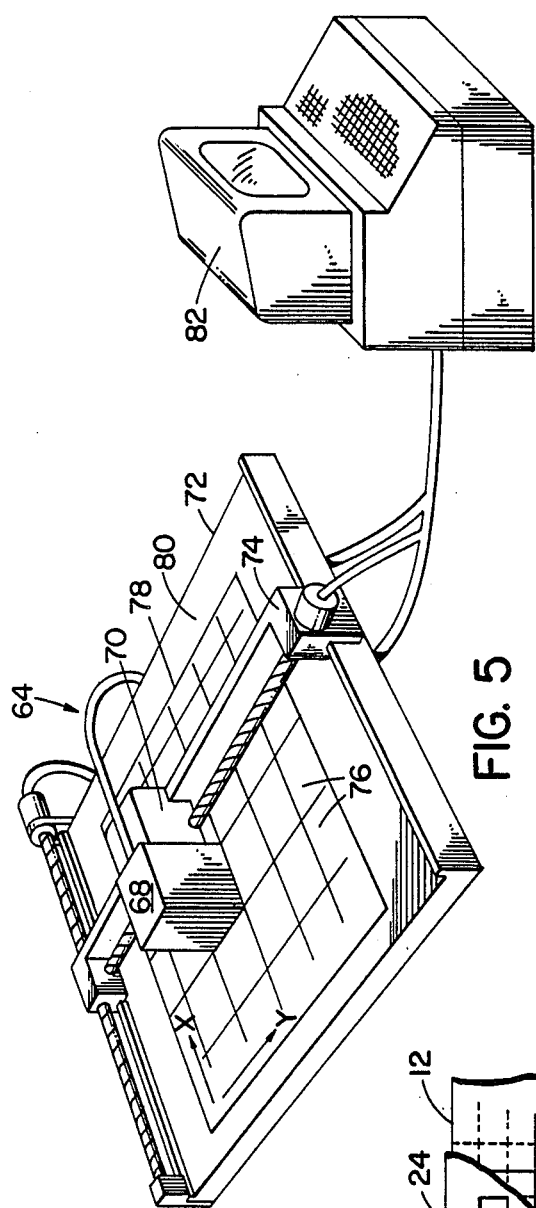
FIG. 5 is a perspective view showing a photoplotter comprising another embodiment of this invention.

In the photoplotters 10 illustrated by FIGS. 1 to 4 the light valve device 24 and light source 20 are of adequate size to expose the entire desired graphic on the sheet 12 without having to move the sheet relative to the device 24, except perhaps the very small amounts discussed above in connection with FIGS. 2 and 3 to produce half-tone images or to accommodate the spaces existing between the light transmitting subareas 28 of the light valve device. Where large graphics are to be exposed it may be impractical to provide an equally large light valve device and in such case the plotter of the invention may be designed to allow movement of the light valve device relative to the photosensitive sheet so that the sheet can be exposed stepwise or progressively in an area-by-area way. One such photoplotter 64 is illustrated in FIG. 5 and comprises a photohead 68 made up of a light source, such as the light source 20 of FIG. 1, and a light valve device, such as the device 24 of FIG. 1, fixed relative to one another in a single unit. This photohead 68 is mounted on the Y-carriage 70 of an X-Y positioning device 72. This device 72, in addition to the Y-carriage 70, has an X-carriage 74 movable in the illustrated X-coordinate direction with the Y-carriage 70 being mounted onto it for movement in the illustrated Y-coordinate direction. Therefore, the photohead 68 may be stepped to different areas 76 of a sheet of photosensitive material 78 supported on the support surface 80 of the device 72. A computer 82 controls the operation of both the X-Y positioning devices 72 and of the photohead 68.

Figure 7:
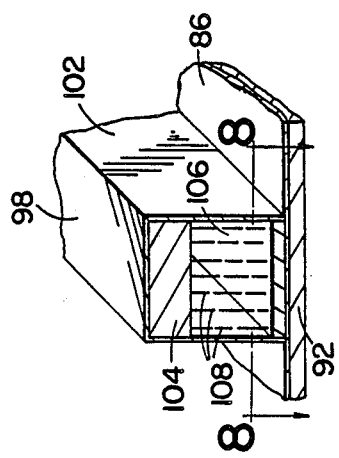
FIG. 7 is a fragmentary sectional view taken generally on the line 7—7 FIG. 6.
Figure 6:
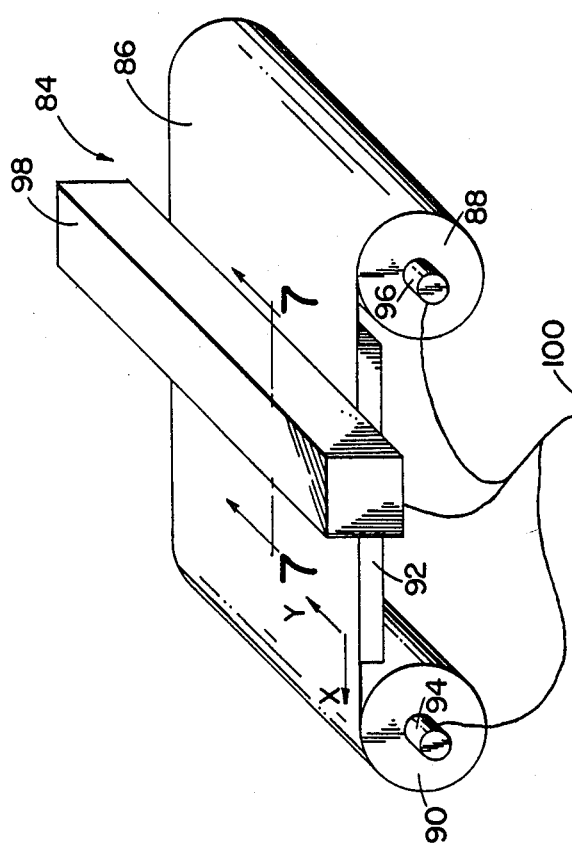
FIG. 6 is a schematic perspective view showing another embodiment of the invention.
Figure 8:
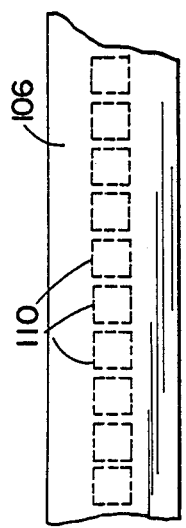
FIG. 8 is a fragmentary view taken on the line 8—8 of FIG. 7.

Another photoplotter 84 for progressively exposing a graphic on a sheet of photosensitive material is shown in FIGS. 6, 7 and 8. In this photoplotter 84 the sheet of photosensitive material 86 is wound on two rolls 88 and 90 and moved in the X-coordinate direction over a support plate 92 by unwinding from the roll 88 and winding onto the roll 90 under the control of a motor 94 and a clutch/brake 96. A photohead 98 extends across the sheet 86 in the Y-coordinate direction, and a computer 100 controls the movement of the sheet 86 in the X-coordinate direction and the operation of the photohead.

The photohead 98, as shown in FIG. 7, has a housing 102 containing a light source 104, generally similar to the light source 20 of FIG. 1, and a light valve device 106, the light source 104 emitting light, represented by the rays 108, onto the light valve device 106.

The light valve device 106 of FIG. 7 may be one generally similar to the device 24 of FIG. 1 wherein the subareas are arranged in a plurality of rows and columns over a rectangular area of substantial length and width, and in this case the photosensitive sheet 86 is advanced stepwise in the X-coordinate direction so that a fresh transversely extending strip of substantial dimension in the X-coordinate direction is exposed during each operation of the photohead 98.

Alternatively, and as shown in FIG. 8, the light valve device 106 of the photohead 98 may have only a single row of subareas or pixels 110. With this form of photohead 98 the photoplotter 84 may be operated so that the advancement of the sheet 86 in the X-coordinate direction is stopped during each operation of the photohead or it may alternatively be operated with the sheet 86 continuously moved in the X-coordinate direction with the operation of the photohead being coordinated with such movement so as to expose a new row of subareas on the sheet each time the sheet moves a distance corresponding to the width of the row of subareas.

In the use of a liquid crystal light valve device 24 such as that illustrated in FIG. 4, the collimated light from the light source is unpolarized with such light becoming polarized as it passes through the polarizing layer 56. If desired, the rear polarizing layer 56 may be omitted from the device 24 and its function transferred to the light source 20. That is, the light source 20 may be constructed so as to emit polarized light thereby rendering the rear polarizing layer 56 of the device 24 unnecessary.

Figure 9:
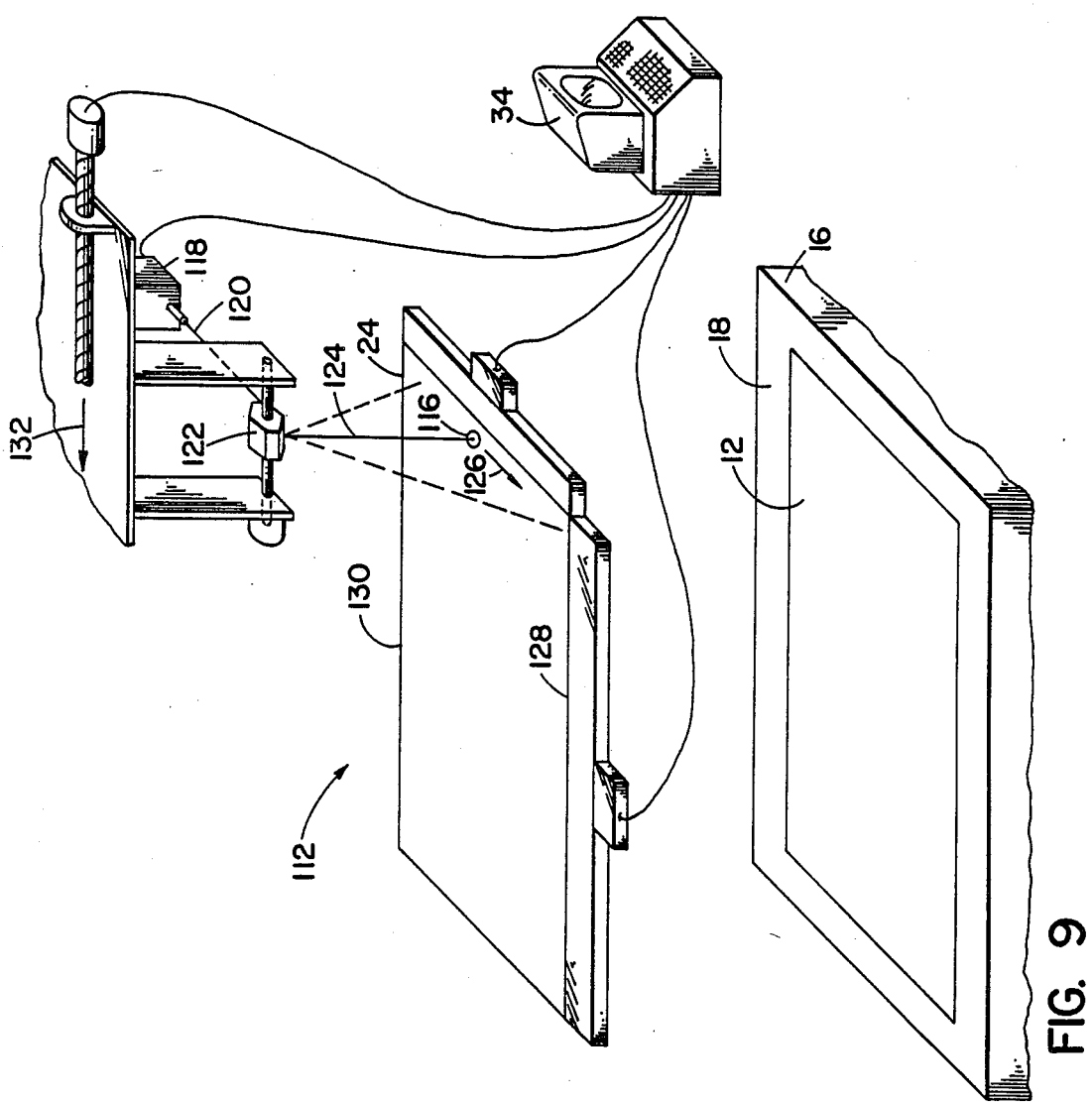
FIGS. 9 and 10 are schematic perspective views generally similar to FIG. 1, but showing photoplotters comprising still further embodiments of the invention.

As mentioned previously, in a photoplotter embodying the broader aspects of this invention the way in which the light valve device is illuminated may vary widely and may take the form of a moving beam of light which is moved in raster scanning fashion over the upper surface of the light valve device. Such a device is shown, for example, in FIG. 9 wherein the illustrated photoplotter 112 includes a table 16 and a light valve device 24 similar to those of the photoplotter 10 of FIG. 1. As the light source the photoplotter 112 includes an illumination unit 114 for scanning a light spot 116 in raster fashion over the upper surface of the device 24. The unit 114 is made up of a light source 118, preferably a laser, which emits a light beam 120 onto a rotating faceted mirror 122 which deflects the beam 120 into a scanning beam 124 which moves repeatedly over the surface of the device 24 in the direction of the arrow 126 between the illustrated front and rear edges 128 and 130 of the device 24. The unit 114 is further movable in a coordinate direction, indicated by the arrow 132, perpendicular to the scanning movement 126 of the beam 124 so that each time the light spot 116 produced by the beam 124 scans across the upper surface of the device 24 it moves along a new line on the device. Such use of a scanning type illumination of the upper surface of the device 24 is of advantage in situations where it is necessary or desirable to have the beam exiting from the light valve 24, and which exposes the sheet 12 held by the table 16, to be of high intensity. It should be noted that in this type of operation the light beam from the laser or other light source 118 may be kept in a continuously "ON" condition during its scanning movement, there being no need to control its "ON" or "OFF" condition pixel-by-pixel as in presently known laser scanning exposure devices.

Figure 10:
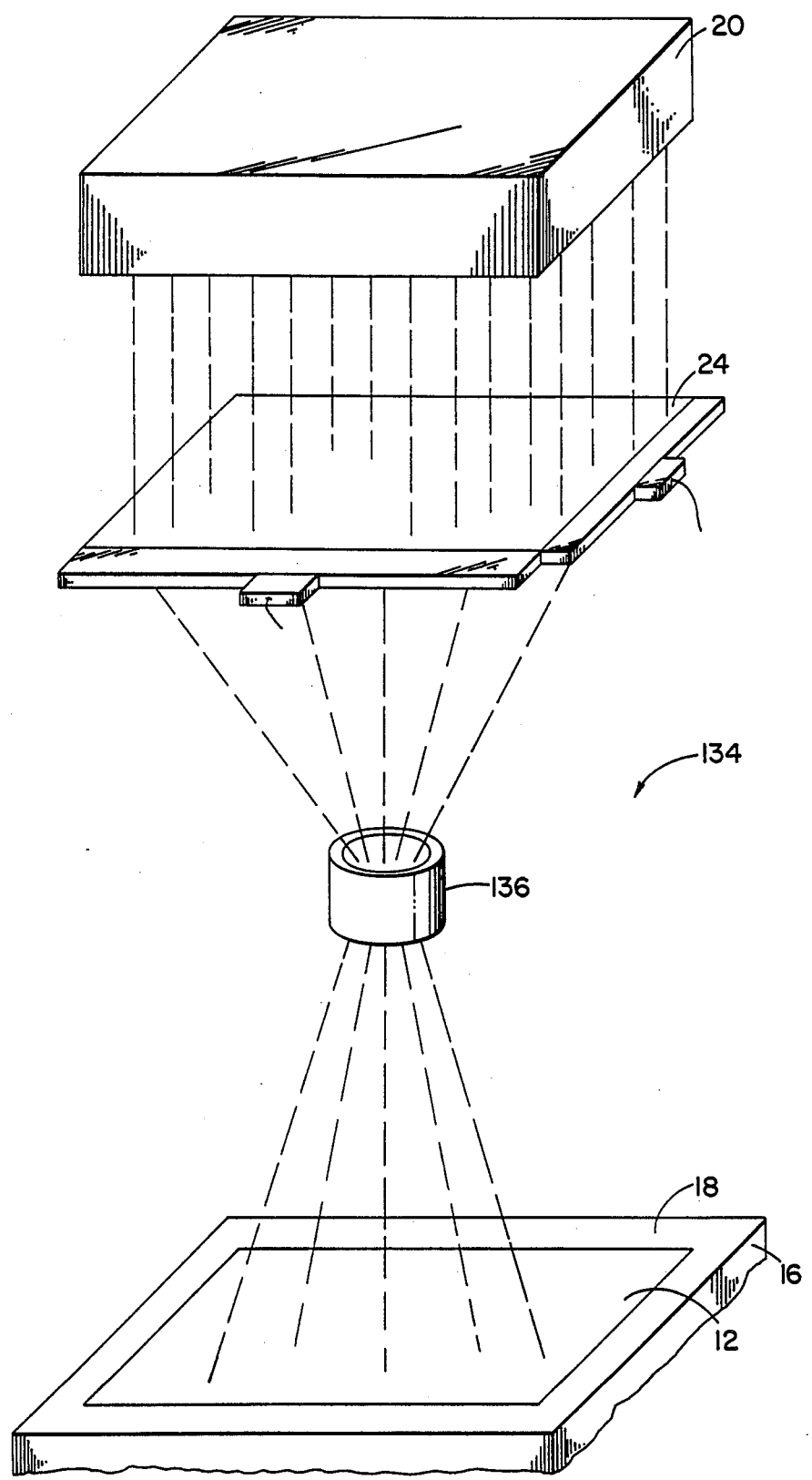

Also, as mentioned above, instead of a photoplotter embodying the invention being one wherein the image created by the light valve device is essentially contact printed on the photosensitive sheet being exposed, a lens may be interposed between the light valve device and the photosensitive sheet to project the image created by the device onto the sheet. This is of special advantage in cases where the light valve device has a substantial thickness and the object plane, the plane in which the image created by the light valve device actually appears, is positioned some distance above the lower surface of the device so that when attempting a contact printing procedure it is impossible to bring the object plane into extremely close proximity to the surface of the sheet 12. A photoplotter 134 embodying the invention is shown in FIG. 10 and comprises a table 16, light valve device 24 and light source 20 similar to those of the photoplotter 10 of FIG. 1. The light valve device 24 is, however, spaced a greater distance from the table 16 than it is in FIG. 1, and interposed between these two components is a projecting lens or lens system 136. The lens 136 is set to focus sharply on the object plane of the device 24 and on the surface of the sheet 12 and therefore projects a sharp image of what appears in that object plane onto the sheet 12. For example, if the device 24 is a liquid crystal one such as that shown by FIG. 4, the actual image created by the operation of that device occurs in the plane of the liquid crystal layer 48 which is spaced a substantial distance from the lower surface of the device 24 because of the thickness of the layers 52 and 44. The lens 136 can therefore be set to focus on the layer 48 so that the image created by the device 24 is sharply transferred to the sheet 12.

I claim:

1. A photoplotter for exposing graphics on a sheet of photosensitive material, said photoplotter comprising a means for supporting a sheet of photosensitive material at an exposure station, a light source operable to direct light toward said exposure station, a light value device located between said light source and said exposure station for controlling the transmission of light from said light source to a sheet of photosensitive material supported at said exposure station in such a way as to expose graphics on such sheet, said light value device having a main area divided into a large number of subareas each of which subareas is individually controllable to vary its light transmissivity, a means asssociated with said light valve device for individually controlling the transmissivity of each of said subareas so that the light passing through said device exposes a desired graphic on a sheet of photosensitive material supported at said exposure station, said light valve device having a neutral position relative to said exposure station, and means for shifting said light valve device in the plane of said main area in two orthogonal directions relative to said exposure station between, for each orthogonal direction, said neutral position and at least one other position spaced from said neutral position by a distance of the same order of magnitude as the maximum dimension of one of said subareas, said subareas being all of substantially the same size and shape and being uniformly spaced relative to one another in rows and columns, the spacing between said rows and the spacing between said columns being of the same order of magnitude as the maximum dimension of one of said subareas.

2. A photoplotter as defined in claim 1 further characterized by said subareas having substantially a dimension d in each of said orthogonal directions, said columns being spaced from one another by a distance of substantially 2d, said rows being spaced from one another by a distance of substantially 2d, and said driving means in each of said orthogonal directions being operable to shift said light valve device by a distance of substantially d in both directions along such orthogonal direction from said neutral position.

3. A photoplotter for exposing graphics on a sheet of photosensitive material, said photoplotter comprising a means for supporting a sheet of photosensitive material at an exposure station, a light source operable to direct light toward said exposure station, a light valve device located between said light source and said exposure station for controlling the transmission of light from said light source to a sheet of photosensitive material supported at said exposure station in such a way as to expose graphics on such sheet, said light valve device having a main area divided into a large number of subareas each of which subareas is individually controllable to vary its light transmissivity, said subareas being all of substantially the same size and shape and being uniformly spaced relative to one another in rows and columns, the spacing between said rows and columns being of the same order of magnituded as the maximum dimension of one of said subareas, a means associated with said light valve device for individually controlling the transmissivity of each of said subareas, the light if transmitted through all of said subareas when said device is fixed relative to said sheet of photosensitive material accordingly exposing a plurality of subareas on said sheet likewise arranged in spaced rows and columns, said light valve device having a neutral position relative to said sheet of photosensitive material, and means for shifting said light valve device and said sheet of photosensitive material relative to one another in two orthogonal directions parallel respectively to said rows and columns of subareas of said light valve device by sufficiently small distances to enable the light transmitted through said subreas of said light valve device, when said device and sheet are shifted from said neutral relative position, to expose subareas of said sheet located between said rows and columns of subareas of said sheet exposed when said device and sheet are in said neutral relative position and light is transmitted through all of said subareas of said device.

4. A process for exposing a graphic on a sheet of light sensitive material, said process comprising: providing a sheet of material having a light sensitive surface and supporting said sheet so as to reveal said light sensitive surface, providing a source of light directed toward light sensitive surface, interposing a light valve device between said light source and said light sensitive surface, said light valve device having a main area generally parallel to said light sensitive surface divided into a large number of subareas each of which subareas is individually controllable to vary its light transmissivity, said subareas further being uniformly spaced relative to one another in rows and columns, the spacing between said rows and columns being of the same order of magnitude as the maximum dimension of one of said subareas, in a first exposure step holding said light valve device fixed relative to said light sensitive surface and at the same time individually controlling the transmissivity of each of said subareas of said light valve device so as to control the light passing through said device to selectively expose associated subareas of said photosensitive surface, shifting said light valve device to a new position relative to said light sensitive surface, and in a second exposure step holding said light valve device and light sensitive surface fixed relative to one another at said new position and at the same time individually controlling the transmissivity of each of said subareas of said light valve device so as to control the light passing through said device to selectively exposure further associated subareas of said photosensitive surface, the amount by which said light valve device is shifted relative to said photosensitive surface between said first and second exposure steps being such that the subareas of said photosensitive surface exposed during said second exposure step fall between those subareas of said photosensitive surface which would have been exposed in said first exposure step had light been transmitted through all of said subareas of said light valve device in said first exposure step.

* * * * *